US008018059B2

(12) United States Patent
Swift et al.

(10) Patent No.: US 8,018,059 B2
(45) Date of Patent: Sep. 13, 2011

(54) ELECTRICAL INTERCONNECT WITH AN ELECTRICAL PATHWAY INCLUDING AT LEAST A FIRST MEMBER OVERLAIN BY A SECOND MEMBER AT A CONTACT POINT

(75) Inventors: Joseph A. Swift, Ontario, NY (US); Stanley John Wallace, Victor, NY (US)

(73) Assignee: Xerox Corporation, Norwalk, CT (US)

( * ) Notice: Subject to any disclaimer, the term of this patent is extended or adjusted under 35 U.S.C. 154(b) by 1504 days.

(21) Appl. No.: 11/094,407

(22) Filed: Mar. 31, 2005

(65) Prior Publication Data

US 2006/0228140 A1 Oct. 12, 2006

(51) Int. Cl.
*H01L 23/48* (2006.01)
*H01L 21/4763* (2006.01)

(52) U.S. Cl. ........ 257/758; 257/734; 257/750; 438/618; 438/622; 438/642; 428/903

(58) Field of Classification Search .................. 257/734, 257/750, 758; 438/618, 622, 642; 428/903
See application file for complete search history.

(56) References Cited

U.S. PATENT DOCUMENTS

| | | | |
|---|---|---|---|
| 4,641,949 A | 2/1987 | Wallace et al. | |
| 4,741,942 A | 5/1988 | Swift | |
| 5,812,908 A | 9/1998 | Larocca et al. | |
| 5,843,567 A | 12/1998 | Swift et al. | |
| 5,885,683 A | 3/1999 | Swift | |
| 5,887,225 A | 3/1999 | Bell | |
| 6,214,921 B1 | 4/2001 | Bluett et al. | |
| 6,444,102 B1 | 9/2002 | Tucci et al. | |
| 6,794,984 B2 | 9/2004 | Komatsu | |
| 7,340,356 B2 * | 3/2008 | Straznicky | 702/65 |
| 2004/0152240 A1 * | 8/2004 | Dangelo | 438/122 |
| 2005/0117441 A1 * | 6/2005 | Lieber et al. | 365/232 |
| 2005/0285116 A1 * | 12/2005 | Wang | 257/76 |
| 2007/0235076 A1 * | 10/2007 | Liu et al. | 136/253 |

OTHER PUBLICATIONS

Li et al.; "Diameter-Controlled Growth of Single-Crystalline In203 Nanowires and Their Electronic Properties"; Adv. Mater. 2003; vol. 15; No. 2; Jan. 16, 2003; pp. 143-146.*
Zhou et al.; "Modulated Chemical Doping of Individual Carbon Nanotubes"; Science vol. 290; Nov. 24, 2000; j~p. 1552-1555.*
Javey, et al.; "Ballistic Carbon Nanotube Field-Effect Transistors"; Nature Publishing Group; vol. 424; No. 7; Aug. 2003; pp. 654-657.*
Coluns, Philip G., Arnold, Michael S., and Avouris, Phaedon; Engineering Carbon Nanotubes and Nanotube Circuits Using Electrical Breakdown, Science, vol. 292 (Apr. 27, 2001).*

* cited by examiner

*Primary Examiner* — Thanh V Pham
(74) *Attorney, Agent, or Firm* — Oliff & Berridge, PLC

(57) ABSTRACT

An electrical interconnect includes an electrical pathway having a first member a second member, the first member being disposed at an oblique or perpendicular angle to the second member at a location adjacent to the second member, wherein at least one of the first member and the second member have a cross-sectional dimension of less than or equal to 10 micrometers.

20 Claims, 4 Drawing Sheets

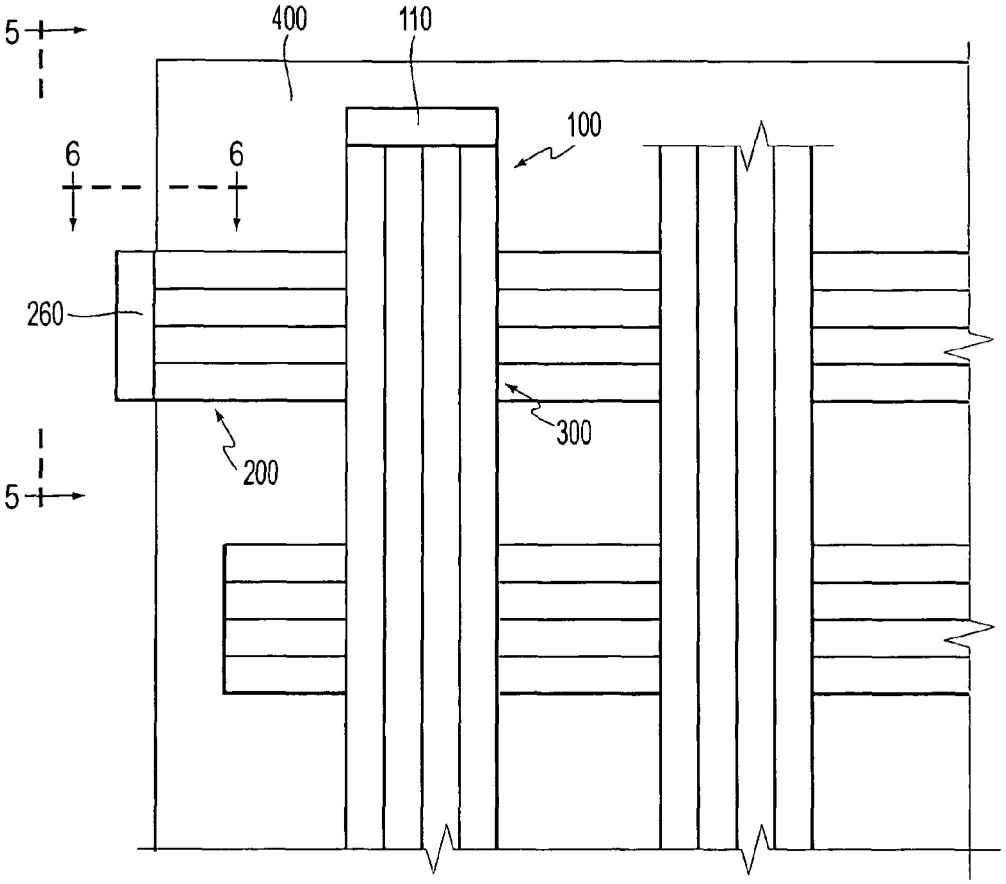
FIG. 4
FIG. 5
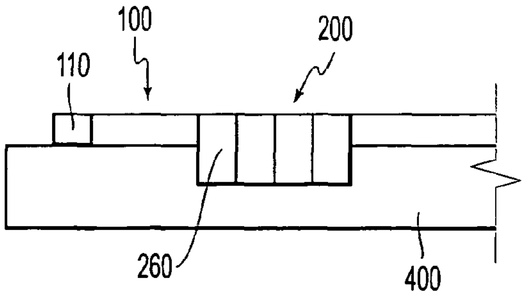
FIG. 6
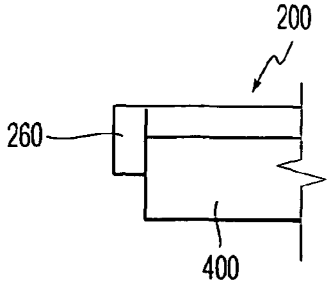

ELECTRICAL INTERCONNECT WITH AN ELECTRICAL PATHWAY INCLUDING AT LEAST A FIRST MEMBER OVERLAIN BY A SECOND MEMBER AT A CONTACT POINT

CROSS-REFERENCE TO RELATED APPLICATION

The disclosure of related U.S. Pat. No. 7,266,322, issued on Sep. 4, 2007, is hereby incorporated by reference herein in its entirety.

BACKGROUND

Electrical interconnects for transferring charge from one member to another member or for carrying and transferring current from one member to another are found in a wide range of fields and applications. For example, printing and copying processes require the transfer of electrical charge to perform many operations, e.g., development, transfer and cleaning operations. Thus, printing and copying devices use electrical contacts to transfer electrical charge and current to perform these operations.

For example, a specific member, e.g., a photoconductive member, is electrically charged by transferring an electrical charge from a first member to the photoconductive member. A contact, e.g., a sliding contact, may be used as the specific member to bias, i.e., to transfer an electrical charge to, the photoconductive member. For example, U.S. Pat. No. 5,887,225 to Bell, the disclosure of which is incorporated herein by reference in its entirety, discloses a charge transfer device that is in electrical contact with the end shafts of a first and second developer roll of a copier through a sliding electrical contact. The charge transfer device electrically biases the rolls by transferring an electrical charge from a voltage source to the end shafts of the developer rolls via the sliding electrical contact. Other methods of transferring an electrical charge either to or from a member include placing the member to be biased in rubbing contact with a stationary brush, a flexible electrically conductive sheet, or a metal strip.

U.S. Pat. No. 6,444,102 to Tucci discloses an electrical contact fabricated in narrow strips that can be around 0.010 to 0.015 inches in thickness. In Tucci, the electrical contact is formed of carbon fibers fused or conductively bonded together and fixed to a carrier. In Bell, the electrical contact is formed of a polymer composite of multiple electrically conductive carbon fibers.

An example of a carbon fiber polymer composite is known by the trade name CarbonConX™. CarbonConX™ includes a high concentration (e.g., >40% weight) of electrically conductive, high strength, continuous carbon fiber tow (or optionally, metalized carbon fiber tow) compounded within a selected host polymer matrix. A tow is defined as a unit of fiber volume where many fibers, for example from a dozen or more to many thousands made from carbon or metalized carbon, are arranged in a generally parallel array. The individual fibers may have a thin surface layer of a suitable polymer coating referred to as sizing, for example a epoxy monomer or polyvinyl pyrollodone (PVP), which serves to facilitate bonding of the fiber to the selected host polymer or to facilitate handling of the fibers during the various manufacturing and compositing processes. Carbon fiber polymer composites may be used as an alternative to metal contacts or traditional conductive plastics in devices for electrostatic discharge applications as well as other application areas, such as sensor components, moving rotational contacts, motors, electrical switch components, etc. Because carbon is generally non-reactive and less susceptible to corrosion when compared to other materials, such as, e.g., metal, carbon fiber has advantages over metal and may be used in harsh or corrosive environments, including saltwater, nuclear power environments, space, medical, and biological fields.

Applying pultrusion methods to produce the carbon fiber composites enables high strength to be obtained and allows many forms of the carbon fiber to be manufactured into various design shapes and configurations, such as, solid rods, tubes, and thin flat sheets. Moreover, the carbon fibers or metalized carbon fibers used in carbon fiber polymer composites are considered, generally, to be of high electrical conductivity as well as high strength and capable of providing statistically regular and evenly distributed electrical contact sites for charge conduction across an interface.

SUMMARY

It is desirable to form an electrical interconnect with one or more of the following properties: (a) improved reliability and redundancy of microscopic electrical contacts, for example within the nanometer to micron size ranges, contained within a larger apparatus; (b) capable of connecting with a large number of contact parts; and (c) capable of being complex and intricately configured. Exemplary embodiments provide apparatus and systems for an electrical interconnect and a method of forming an electrical interconnect.

Exemplary embodiments provide an interconnect comprising, an electrical pathway including a first member and a second member, the first member being disposed at an oblique or perpendicular angle to the second member at a location adjacent to the second member; wherein the first member and the second member have a cross-sectional dimension of less than or equal to 100 micrometers.

Exemplary embodiments provide an interconnect wherein at least one of the first member or the second member is formed of a material that does not permanently deform until being subjected to an elongation of greater than approximately 2%.

Exemplary embodiments provide an interconnect wherein at least one of the first member or the second member has an aspect ratio of at least 100.

Exemplary embodiments provide an interconnect wherein the first member and the second member share multiple common electrical contact points, thereby having connection redundancy between at least a first point and a second point.

Exemplary embodiments provide an interconnect wherein the electrical pathway forms a structural support.

Exemplary embodiments provide an interconnect wherein the electrical pathway has a contact point for an electrical interface, and the contact point has a cross-sectional area less than or equal to approximately 7850 square micrometers.

Exemplary embodiments provide an interconnect wherein at least one of the first member or second member are formed of carbon.

Exemplary embodiments provide a xerographic device comprising an interconnect.

Exemplary embodiments provide an interconnect wherein the electrical pathway is formed of a composition comprising a metallic element.

Exemplary embodiments provide an interconnect wherein the electrical pathway includes a matrix of other material.

Exemplary embodiments provide an interconnect wherein the other material of a matrix is a polymer resin and the polymer resin contains at least one of a clay, a silica or a titania material.

Exemplary embodiments provide an interconnect wherein the other material of a matrix is a polymer resin and the polymer resin contains a thermosetting polymer, the thermosetting polymer providing in-process handling and shaping of the interconnect prior to, generally, completely curing.

Exemplary embodiments provide an interconnect wherein the other material of a matrix is a polymer resin and the polymer resin contains conductive ceramic materials.

Exemplary embodiments provide an interconnect wherein the other material of a matrix is a polymer resin and the polymer resin contains a nanoelement.

Exemplary embodiments provide an interconnect wherein the other material of a matrix is a polymer resin and the polymer resin contains a nanoelement, wherein the nanoelement is formed of at least one of nickel, titanium, tungsten, copper, boron, tin, lead or a noble metal.

Exemplary embodiments provide an interconnect wherein the other material of a matrix is a polymer resin and the polymer resin contains a nanoelement, wherein the nanoelement is formed of carbon.

Exemplary embodiments provide an interconnect comprising, an electrical pathway including a first member having a cross-sectional dimension of less than or equal to 100 micrometers.

Exemplary embodiments provide a method of forming an electrical interconnect comprising, forming a sheet including a first layer of multiple, generally, parallel members of a material in a matrix of other material, the other material including a thermosetting polymer; cutting an area of the first layer into an initial shape, the area having a first electrical contact point and a second electrical contact point; at least one of heating or pressurizing the area; allowing the thermosetting polymer to partially cross-link and cure; mechanically deforming the area; allowing the thermosetting polymer to further cross-link and cure; and inserting the first point into an electrical interface and the second point into another electrical interface.

These and other features and advantages of the invention are described in or are apparent from the following detailed description of the systems, methods and apparatus of various exemplary embodiments.

BRIEF DESCRIPTION OF THE DRAWINGS

Exemplary embodiments will be described in detail, with reference to the following figures in which like reference numerals refer to like elements, and wherein:

FIG. 4 illustrates another exemplary embodiment of an electrical interconnect;

FIG. 5 illustrates a cross-section of the electrical interconnect shown in FIG. 4; and FIG. 6 illustrates another cross-section of the electrical interconnect shown in FIG. 4.

DETAILED DESCRIPTION OF EMBODIMENTS

The following detailed description describes exemplary embodiments of apparatus, methods and systems relating to an electrical interconnect. For the sake of clarity and familiarity, specific examples of electrical and/or mechanical devices may be given. However, it should be appreciated that the principles outlined herein may be equally applied to any electrical and/or mechanical device.

Figure 1:
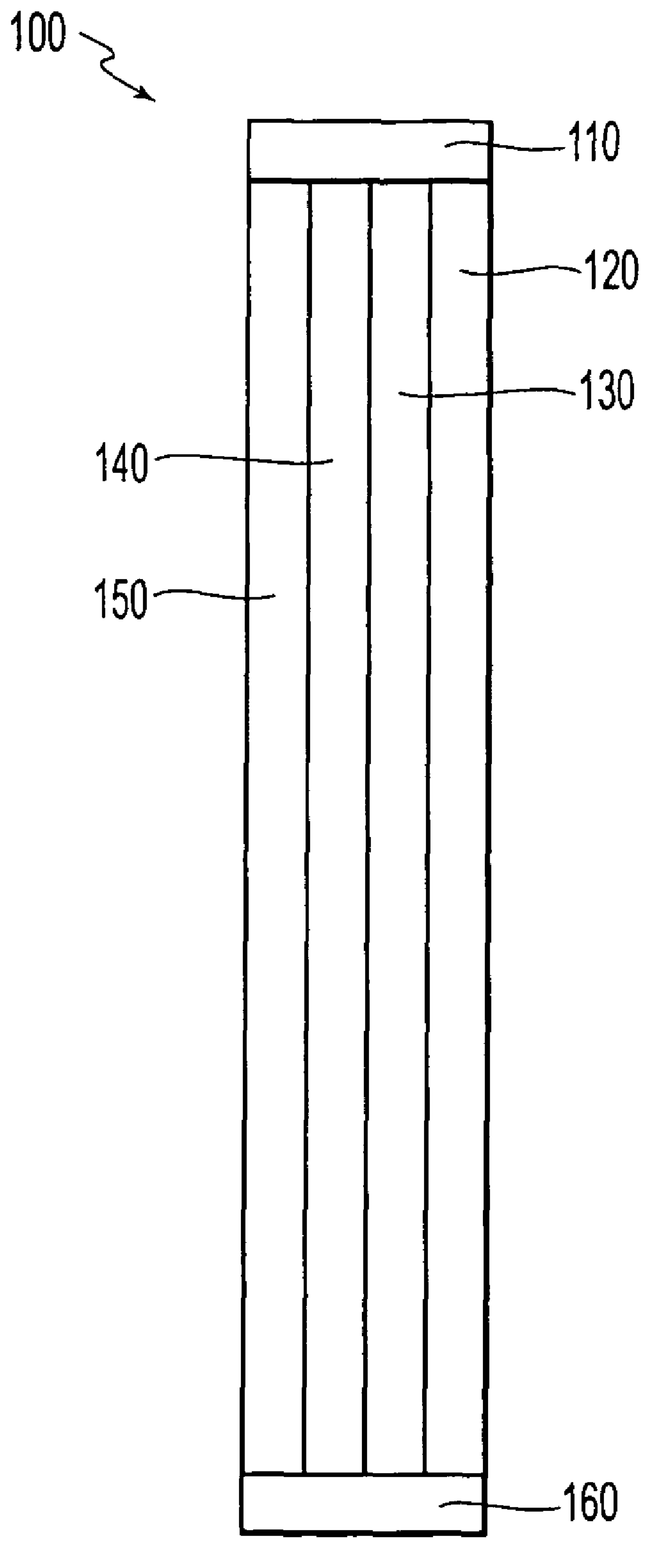
FIG. 1 illustrates an exemplary embodiment of an electrical interconnect.

FIG. 1 illustrates an exemplary embodiment of an electrical interconnect. The electrical interconnect includes an electrical pathway 100 from a first point 110 to a second point 160. The electrical pathway may include multiple electrically conductive members, e.g. 120, 130, 140, extending in a substantially parallel direction. The electrically conductive members may extend parallel to the longitudinal direction, that is the direction from first point 110 to second point 160, of the electrical pathway 100. The members may be referred to in the following description as, for example, conductive fibers, carbon fibers or nanoelements.

Figure 2:
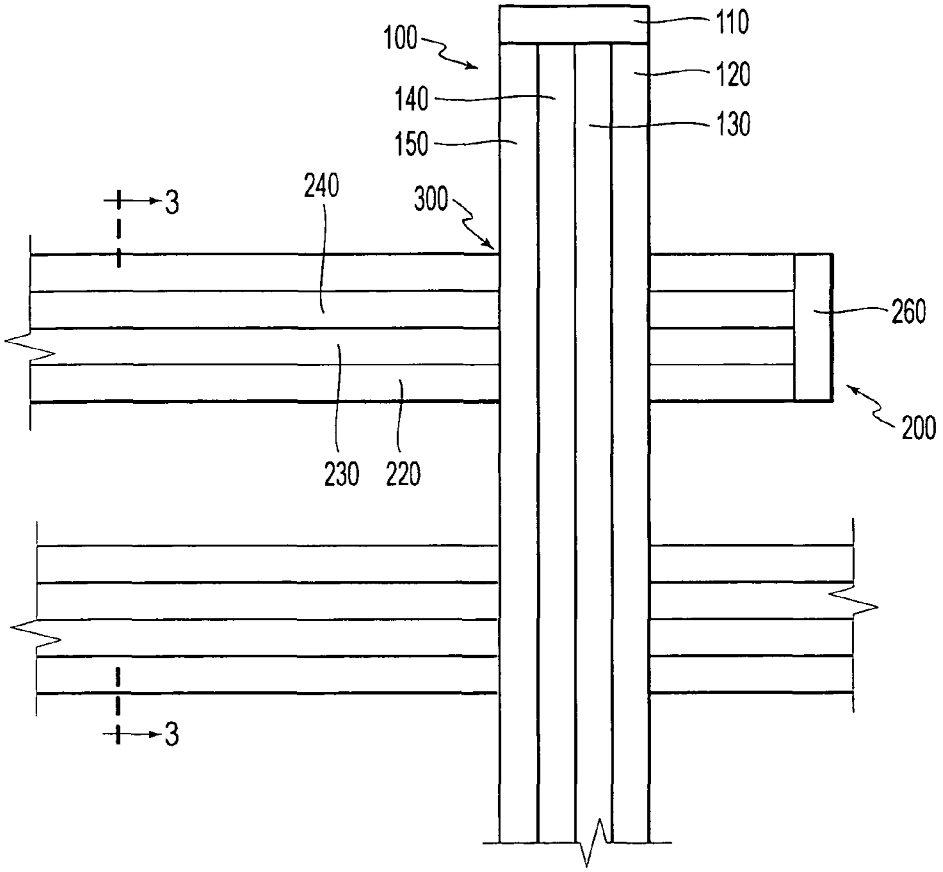
FIG. 2 illustrates another exemplary embodiment of an electrical interconnect.
Figure 3:
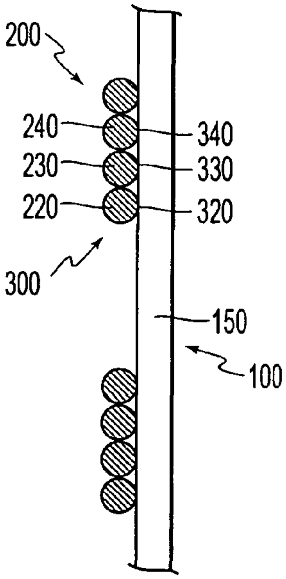
FIG. 3 illustrates a cross-section of the electrical interconnect shown in FIG. 2.

FIGS. 2 and 3 illustrate another exemplary embodiment of an electrical interconnect. In FIGS. 2 and 3, electrical pathways 100, 200 are formed in a layered structure. The structure of the pathways relative to each other may be varied. For example, the pathways may criss-cross each other and form a netting or spider web-like shape. The pathways may also form a sheet, cube, sphere etc. Generally, the pathways may form any two or three-dimensional shape. For example, as shown in FIG. 2, electrical pathway 200 is disposed adjacent to electrical pathway 100. As shown in FIG. 2, the electrical pathway 100 and electrical pathway 200 may be oriented at an angle with respect to each other. The angle may be any angle. That is, the electrical pathways 100, 200 may be parallel, perpendicular, or at an oblique angle to each other. Each electrical pathway may include multiple electrically conductive members, e.g., 120, 130, and 140, corresponding to pathway 100; and, e.g., 220, 230 and 240, corresponding to pathway 200.

As shown in FIG. 3, a node 300 may be formed at a common point where the electrical pathway 100 is disposed adjacent to the electrical pathway 200. The node 300 provides a junction that may act as another electrical pathway for electrical signals or parts to travel from the electrical pathway 100 to the electrical pathway 200. A node may be formed wherever a member abuts another member. For example, when multiple members are formed in an array and share common contact points, e.g., 320, 330, 340, a plurality of common contact points may function as a node and provide the members with contact redundancy within the node. An electrical signal or electrical power will typically follow a particular member until it encounters a resistance within the pathway in which it is flowing and in the instance where the resistance is great enough and there exists a nearby alternate pathway, the electrical signal or power will travel around the resistance. Thus, when two members share multiple common contact points within a node, and an electrical signal or electrical power is impeded or meets a greater resistance in a first member than in a second member, the electrical current or charge will travel through a common contact point to the second member to avoid the greater resistance. Thus, the electrical power or signal will follow the path of least resistance from a first point to a second point.

The use of a node as a pathway for an electrical signal or power to transfer from one member to another member is not limited to members that are parallel. For example, exemplary embodiments provide for electrical transfer between a member formed in one pathway to an adjacent and non-parallel member formed in another pathway. For example, as shown in FIG. 2, if an electrical signal or power is intended to travel from a first point, e.g., point 110, to a second point, e.g., point 260, that is, from electrical pathway 100 to electrical pathway 200, the electrical signal or power will need to travel from a member of the electrical pathway 100 to a member of the electrical pathway 200. For example, as shown in FIGS. 2 and 3, an electrical signal or power may travel from point 110 to point 260 by traveling through member 150 and contact point 320 to member 220.

FIGS. 4-6 illustrate another exemplary embodiment of an electrical interconnect. As discussed above with reference to FIGS. 2-3, in FIGS. 4-6, an electrical interconnect includes an electrical pathway 100 and an electrical pathway 200. A first point, e.g., point 110, of electrical pathway 100 is connected to a second point, e.g., point 260, of electrical pathway 200 through node 300. The electrical interconnect can be formed by a method, for example, as described below, and be placed on a substrate 400.

The members of the electrical pathways, shown in FIGS. 1-8, may be formed of a conductive fiber composite, e.g., a carbon fiber polymer composite or a metalized carbon fiber composite. The members of the electrical pathways, may contain nanostructures, such as a carbon nanotubes, nanofibers, nanowires, nanorods, or other similar nanostructures within the composite. Alternatively, the members of the electrical pathways may be formed of nanostructures within a composite. In addition to the conductive member, members may contain micron-size, sub-micron size, or nanosize metal, metal oxide, metal alloy, or conductive ceramic particles within the host polymer. Members may be formed of carbon, metal or other material. Members formed of conductive fibers, e.g., carbon fibers or metalized carbon fibers, may have a cross-sectional dimension, e.g. a diameter, in the range of approximately 1 to between 50 and 100 micrometers, but typically in the range of 5-10 micrometers. Members formed of nanostructures, such as a nanotube structure, may also be formed in fiber form; however, nanostructures will, generally, have a cross-sectional dimension in the range of approximately 1 to 100 nanometers. The size of the members may be uniform or similar. Alternatively, they may be of non-uniform size, cross-section, and have different or mixed sizes.

The ends of the members of the electrical pathway 100, located at first point 110 and/or second point 160, may be fibrillated, i.e., each end may be divided, for example, by selective removal of the host polymer at the contact region, into a plurality of individually-acting members, to create a densely distributed member contact. Given this plurality of individually acting members, the densely distributed member, i.e., filament, contact may provide an extremely high level of contact redundancy ensuring reliable electrical contact with another contact surface. For example, at the millimeter scale, a contacting component may have 10 or more, 100 or more, or even 1,000 or more, individual conductive members per square millimeter. However, a densely distributed member contact with an extremely high level of contact redundancy may be satisfied at even a smaller scale. For example, at the micrometer scale, three to five members each having a diameter of 5-10 micrometers may be cut to produce an approximately 60-400 square micrometer contact. Similarly, at the nanometer scale, nanoelement members may be cut to produce a 300-500 square nanometer contact. For example, a single nanotube having a 30 nanometer diameter could be used as a micro-miniature member contact to create an approximately 700 square nanometer contact. The electrical interconnect's contact size at the micrometer and nanometer scale is driven, in part, by the requirements of the electric circuit, e.g., current density.

The conductive composite that forms the densely distributed member contact may be formed by a pultrusion process. A pultrusion process is described in U.S. Pat. No. 5,885,683 to Swift, the disclosure of which is incorporated herein in its entirety. The pultrusion process may include pulling continuous lengths of members through a polymer resin bath or impregnator and then into a pre-forming fixture, e.g., a die opening, at an elevated temperature to produce a member and host resin composite. The pultrusion process may utilize thousands of members contained within a single polymer matrix. The pre-forming fixture can produce a component of virtually any shape, e.g., a rod, a tube, bar, sheet, etc. Because the members are pulled through the polymer resin bath in a continuous length, the shaped component is formed with the members being, generally, continuous from one end of the component to the other end of the component. The members are oriented in a direction substantially parallel to the axial direction of the component, i.e., the longitudinal direction along the major axis of the component produced by the pultrusion process. The resin employed may be either a thermosetting polymer or a thermoplastic polymer. In the case of a thermosetting polymer, the resin may be initially partially cross-linked to enable, for example, in-process handling and shaping operations (such as bending or coiling). The polymer may later more completely cure or be post cured to finalize the process. Fillers, such as nanoparticles, nanotubes, nanowires, and the like of suitable conductive or nonconductive materials can be added to the polymer, by, for example, liquid dispersion, or can be applied to the surface of the members, for example by electrostatic spray or other suitable coating process, and pulled into the process along with the members.

After being shaped by the die, the shaped component can be further cut and/or shaped by, for example, a tool, such as a laser, die punch, or water jet. The tool may be used to cut the shaped component into virtually any shape. Moreover, a tool, such as a laser, die or water jet, may be used to fibrillate end points of the shaped component to create a densely distributed fibrous contact at an end point. As discussed above, the shaped component is originally created by pulling continuous lengths of members through a polymer resin bath or impregnator. As such, the members are covered in polymer resin. The polymer resin, when solidified, serves as the host binder for the composite. Since the polymer resin may comprise as much as 50% of the total weight of the composite and is relatively weak when compared to the member reinforcement, additional fillers, such as nanoparticles of suitable reinforcing materials such as clay, silica, titania, and the like may be used to reduce the total amount of resin in the composite and add strength to the resin. The laser or water jet could be used to remove the polymer resin and filler at an end point, and provide a smoother and more conductive contact surface for mating with another electrical contact.

The polymer resin part of the component may include a suitable thermoplastic, e.g., polyphenylene sulfide (PPS), polyetheretherketone (PEEK), nylon, polyester, polyethylene, polystyrene, acrylonitrilebutadien (ABS), or copolymers or blends thereof. Alternatively or additionally, the polymer resin part may be a thermosetting polymer such as epoxy, polyimide, polyester, and the like and may include a catalyzed, partially cross-linked or green stage thermal setting polymer resin (for example, MODAR™, a modified epoxy-acrylic) and may include a suitable metal, e.g., nickel powder. The members may be metalized to increase conductivity of the composition and/or provide other mechanical, thermal, or physical properties.

Exemplary embodiments provide multiple unidirectional, that is, parallel, members shaped collectively in the form of a ribbon by the pultrusion process. The ribbon is cut using a tool, for example, to die-cut or otherwise pattern-cut a precisely shaped, flat form from the ribbon. Heat and/or pressure may be applied to the cut flat-form shape to soften the cut shape. Once the cut shape has been softened, the cut shape may be mechanically deformed in a bend-and-configure process to form the shape of the electrical interconnect desired. The bend-and-configure process may be used to create intricate bends as necessary in the cut shape. After the bend-and-configure process is complete, the cut shape is allowed to solidify by, e.g., chemical cross-linking and/or cooling. Fibrillation of the contact points may occur before or after the component has solidified.

Figure 7:
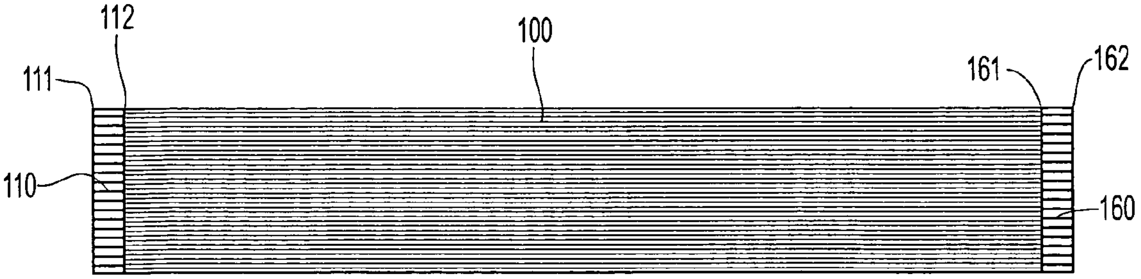
FIG. 7 illustrates an exemplary embodiment of an electrical interconnect having fibrillated ends.

An example of an electrical interconnect having fibrillated ends is illustrated in FIG. 7. In FIG. 7, the polymer resin at the ends of the electrical interconnect has been removed over a given length, for example, the length between points 111 and 112, and points 161 and 162. The members within this given length, or region, are unconstrained by the polymer resin and can act independently.

Fibrillating is defined as making multiple primary units (e.g. members or filaments) out of a solid unit. The unit may be a fiber, in which case the term "flagging" is often used by textile experts. Alternately, it may be a unit containing primary substructures such as many fibers. In such a case, fibrillating refers to subdividing the unit into its primary solid components, or making fibers, which are a thin shaped solids from a larger solid.

An example of an electrical interconnect having an electrical pathway formed of members in the form of commercial nickel metallized carbon fiber tow, is discussed in detail below. The electrical pathway may contain, e.g., from 1,000 to over 150,000 individual fibers. The commercial nickel metallized carbon fiber tow can be combined with, e.g., PPS, a thermoplastic, to form a composite containing approximately 80% carbon fiber by volume. A dry powder electrostatic coating process may be used during the pultrusion process to combine the fiber and polymer into the ribbon shaped composite. The dry powder electrostatic coating process may use air jets to spray a fine powder of PPS to generally uniformly coat the nickel carbon fiber tow while continually moving the nickel-carbon fiber tow on a conveyor and spreading the individual continuous fibers into an array such as a flat ribbon array, for example. Alternately, a composite, blend, or mixture of PPS powder and a suitable nanosize filler, for example carbon nanotubes can be used to coat the fibers. The powder coated fiber array is then heated to a temperature greater than the melting temperature of the PPS and drawn into a forming die. The die envelops the molten polymer-coated fiber mass thereby transferring the die's internal shape to the polymer-coated fiber mass and forming the composite. The composite is thereby cooled and allowed to solidify into the desired shape, such as, e.g., a ribbon shape. More intricate shapes may be formed using a tooling process, such as, e.g., a mechanical die punching process, to further define the cut shape. For example, a mechanical die punching process, similar to the crunch-and-punch process known in the art to produce inexpensive, flat circuit boards, can be used to perform this shape cutting step. Alternatively, or in combination, as discussed above, another tool, such as, e.g., a robot manipulated laser or water jet, or chemical processes, such as, e.g., solvent washing or acid etching, can be used in the cutting operation.

Pressure and/or heat may be applied to the cut shape in order to allow the cut shape to be mechanically deformed into a desired configuration. For example, a suitably heated shape forming die can be used to thermally bend and form the structure into the desired configuration. The desired configuration may resemble the shape of an electrical interconnect. Upon solidifying, the shape becomes a, generally, rigid and self-supporting structure. Alternatively, the shape may be self supporting and flexible. After solidifying, the component may be further mechanically shaped. The contact points may be fibrillated before or after the component has solidified. After fibrillation, selective metal plating or patterned metal vapor deposition can be used to apply additional layers of metals at various local contact positions. Finally, the electrical interconnect can be inserted into a parent housing to form the interconnect assembly.

Electrical interconnects made for the micrometer and/or millimeter scale are often formed of various metals and/or metal alloys. When electrical current is applied to the metal-containing interconnects, particularly under conditions that can cause arcing or in harsh or contaminated atmospheres, the metal may react with the surrounding environment to generate unwanted high resistance contaminants, debris, and/or artifacts that may degrade the electrical functions of the contact and/or corrode the contact. Moreover, when metal electrical interconnects are mechanically deformed, such as, when the interconnects are originally shaped, the mechanical deformation, e.g., tooling, may leave an artifact of the manufacturing and/or forming process. The artifact may be a crack, sharp edge, and/or other physical attribute that will affect electrical function over time. For example, the artifact may allow contaminants and/or debris to form and grow in the artifact area. The contaminant and/or debris may reduce the active conductive cross-section of the electrical interconnect and/or reduce corrosion resistance, and thus contribute to the failure of the device.

Using members made of carbon to transfer an electrical charge or current provide advantages over metal interconnects. First, carbon is less reactive to many substances than most metals. Second, because the carbon members are relatively flexible and continuous when the polymer resin composition is heated to a temperature near its melting point, the carbon fibers can be mechanically deformed for a particular application without producing significant cracks, defects, or other artifacts. For example, the polymer resin composition transitions from liquid to solid relatively predictably and does not generally introduce flaws at high stress point areas, such as the flaws or pores that may occur with a metal interconnect. Carbon is generally heat tolerant at many of the processing temperatures of thermoset/thermoplastic polymers, and thus, the carbon is, generally, unaffected by the heating process (e.g., between 50° C. to 500° C.). Moreover, because carbon has a relatively high modulus of elasticity, carbon can withstand a relatively high tensile load prior to failure. Carbon members made by or used in the methods as described above may experience approximately 2-10% elongation or bending extension before damage or breakage occurs (members made of materials other than carbon may experience approximately 2-200% elongation or bending extension before damage or breakage occurs). Furthermore, as is known in the art, sufficient force must be applied to contacts in mutual contact to adequately transmit electric current between the contacts. All things being generally equal, if the interface between electric contacts is clean and smooth, the force required to transmit current from an electrical contact made of mostly carbon members, is in the range of about 10 to 100 grams, which is considerably less than the force required to transmit current between contacts made of metal, e.g., about equal to or greater than 250 grams (0.5 pounds).

For example, an electrical interconnect may be formed of a large concentration (e.g., greater than 50% by weight) of continuous length, high strength, conductive, carbon members in a polymer composite. The percentage of carbon members in the polymer composite is a factor in determining properties, e.g., resilience, conductivity, and strength, of the electrical interconnect. Similarly, the percentage of other materials in the electrical interconnect, such as, e.g., polymer, as well as the type, size, and degree of dispersion of fillers within the polymer, as well as the methods by which the fillers and/or polymer were processed, and the like, will affect the properties of the electrical interconnect. Because the electrical interconnect may be formed of carbon members, and as discussed above, carbon is, generally, less reactive with many of the substances found in related art electrical and/or mechanical environments, a carbon containing electrical interconnect provides the advantages of a longer service life and greater reliability over traditional metal-type interconnects.

However, in some respects, metal may have advantages over carbon. For example, many metals have conductivity, strength, and processing characteristics that may provide desirable features for an electrical interconnect. For example, a metal interconnect may be designed to withstand greater electrical current or mechanical deformation than a carbon member composite interconnect before failure. As such, exemplary embodiments provide a carbon interconnect reinforced with metal. For example, metal may be added to the skin of the carbon member to strengthen and/or mechanically reinforce the carbon member. The metal can also effectively increase the thermal and/or electrical conductivity of the member. Similarly, other mechanical properties of metals may be somewhat transferred to a carbon member interconnect by including a metal with the interconnect. For example, if magnetic properties of the composite are important, an iron coating may be applied to the members.

At the nanometer scale, either carbon or metal may be used for an electrical interconnect with success. At this scale, nanoelements are formed in what may be called nanostructures, such as, e.g., nanotubes, nanorods, nanofibers, or nanowires, out of carbon and metals that have high aspect ratios. For example, metals such as nickel, titanium, tungsten, copper, boron, tin, lead or a noble metal may be used. Alternatively, partially conductive silicon may be used. The nanoelements may be formed with a diameter of from about 10 nanometers to about 100 nanometers and have aspect ratios as great as, or greater than, 100 or 1000:1. The aspect ratio is the ratio of the length of the nanotube to the width or diameter of the nanotube. Thus, the lengths of the nanotube may be at least 100 and maybe more than 1000 times the diameter of the nanotube. Nanoelements of this type, such as carbon nanotubes having either single or multiple walls, boron nitride nanotubes, copper or gold nanowires, or tungsten nanofibers may be included as conductive members, or as parts of conductive members in the continuous, or nearly continuous pathways of the electrical interconnect. The nanoelements may be used as particles within the composite to improve or alter the electrical interconnects electrical, mechanical, thermal, or physical properties.

At the nanometer scale, nanostructures, e.g., nanotubes, made out of carbon or metal, generally, do not form the artifacts, particularly when employed as a composite as described herein, that affect traditional larger-scale metal contacts. As such, at the nanometer scale, some of the advantages of using metal can be obtained because many of the properties that can be obtained at the nanoscale can be directly translated to the larger scale and thereby yield enhanced properties which cannot be achieved by other means. Blends of carbon and metal nanoelements, particularly when blended with conventional carbon fiber in a suitable host polymer to form a conductive composite, can result in a highly reliable electric interconnect.

In exemplary embodiments, the members forming the electrical pathway may provide electrical redundancy for each other. For example, in exemplary embodiments, the members are formed in a, generally, parallel and electrically continuous arrangement along the length of the pathway. A sister member, that is, a member parallel and adjacent, or simply adjacent, to another member along a portion of that member's length, has the potential to participate in conveying and/or conducting electrical signals or power provided in another member. Thus, the sister member will provide redundancy to another member so long as the sister pathway is electrically connected to other member. Of course, the amount of the current a sister member or another member carries at a particular point will be a function of the resistance of that member at that particular point.

In exemplary embodiments, at least one of the members forming the electrical pathway may serve one electrical function, e.g., a voltage application function, and another one of the members may serve another electrical function, e.g., a voltage sensing function. The members may be disposed in the electrical pathway such that the members serving a particular function are isolated from members performing another function. That is, the members may be isolated by a barrier (e.g., a non-conductive barrier) disposed between the members. Thus, the electrical pathway may include multiple pathways. Each pathway may serve a distinct electrical function, or serve a function redundant to another pathway. The multiple pathways may be mechanically coupled to each other. If multiple, electrical pathways are to serve the same function, a pathway may be provided between the members such that electrical power or signals pass from one member to another.

It should be appreciated that exemplary embodiments of an electrical interconnect may have any shape and configuration capable of performing an electrical function, e.g., transferring an electrical potential or current from a first point to another point. Moreover, because the electrical interconnect can adopt many shapes, generally any location in any electrical device in which an electrical signal or power may be applied to a particular point or area would be suitable for locating and configuring the electrical interconnect.

As discussed above, the percentage of a specific ingredient, such as, e.g., carbon, plastic polymer, resin, metal, fillers, etc., in an electrical interconnect may be manipulated to provide the electrical interconnect with specific properties. Thus, the electrical interconnect should be designed for the specific feature(s) it will provide in a device or component. That is, the specific ingredients (e.g., member material, metal constituents, member type and size, member orientation, polymer type, and cross-link density) and processing methods (e.g., temperature, pressure, and atmosphere) should be selected to yield target electrical and mechanical properties that have been optimized for a particular application. For example, if the electrical interconnect is intended to transfer an electrical current, the electrical interconnect should be designed to optimize the electrical circuit which relies upon achievement of a reliable mechanical contact force between mating contacts. For example, the spring constant or bending modulus of the electrical interconnect may be optimized to provide an adequate bending feature, such as contact force or contact area of the electrical interconnect when it is being formed or located on a device. As is known in the art, the spring constant or bending modulus of a material is controlled by its composition, size, shape and processing. Similarly, the external skin of the electrical interconnect should be tailored for both the electrical and mechanical functions of the electrical interconnect. For example, the skin of the electrical interconnect should provide for whatever degrees of movement are required of the electrical interconnect, during forming, placement, and use.

Figure 8:
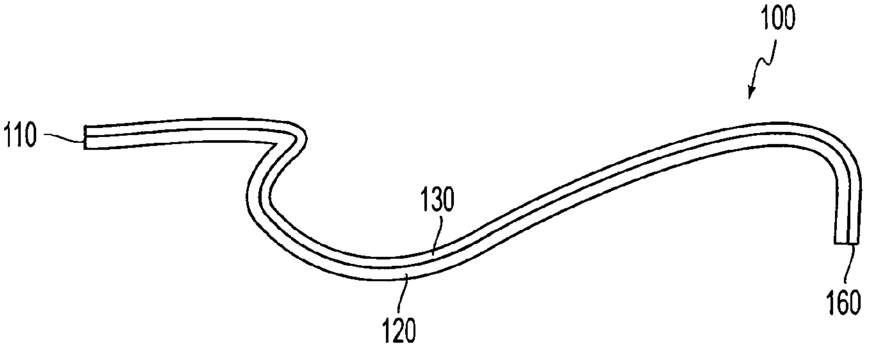
FIG. 8 illustrates an exemplary embodiment of an electrical interconnect formed of members and having multiple bends.

As such, while some exemplary embodiments, e.g., as shown in FIG. 4-6, illustrate an electrical interconnect formed in a ribbon shape 200 and disposed on a carrier 400, exemplary embodiments may also provide structures that may be formed in a wide range of shapes, be self-supporting and/or support other elements. Similarly, while the embodiments illustrated in FIGS. 1-7 show an electrical interconnect formed of electrical pathways having a straight or linear form, exemplary embodiments may also provide an electrical interconnect formed of electrical pathway(s) having multiple bends. Thus, an electrical interconnect may be formed in virtually any shape, e.g., a Z shape or S shape. For example, FIG. 8 illustrates an exemplary embodiment of an electrical interconnect formed of members and having multiple bends. Thus, exemplary embodiments of an electrical interconnect having a wide range of electrical and mechanical properties can span a wide range of fields.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An interconnect comprising, an electrical pathway including a first member comprising a first plurality of substantially parallel members layered with a second member comprising a second plurality of substantially parallel members, the first member being disposed at an oblique or perpendicular angle to the second member, wherein the first member is located in a first plane parallel to a second plane where the second member is located and a contact point between the first member and the second member is a point at which the first member is overlain by the second member, the first member and the second member have a cross-sectional dimension of less than or equal to 100 micrometers, at least one of the plurality of members of the first member is in contiguous contact with another of the plurality of members of the first member within the first plane, at least one of the plurality of members of the second member is in contiguous contact with another of the plurality of members of the second member within the second plane, at least one of the plurality of members of the first member is configured to perform a first function, another of the at least one of the plurality of members of the first member is configured to perform a second function, and the first function is different from the second function, a non-conductive barrier is provided between the at least one of the plurality of members of the first member configured to perform the first function and the another of the at least one of the plurality of members of the first member configured to perform the second function, and the first member and the second member are in contact with a substrate.

2. The interconnect of claim 1, wherein the interconnect is formed using a method of forming an electrical interconnect comprising, forming a sheet including a first layer of multiple, generally, parallel members of a material in a matrix of other material, the other material including a thermosetting polymer;

cutting an area of the first layer into an initial shape, the area having a first electrical contact point and a second electrical contact point;

at least one of heating or pressurizing the area;

allowing the thermosetting polymer to partially cross-link and cure;

mechanically deforming the area;

allowing the thermosetting polymer to further cross-link and cure; and inserting the first point into an electrical interface and the second point into another electrical interface.

3. The interconnect of claim 1, wherein at least one of the first member or the second member is formed of a material that does not permanently deform until being subjected to an elongation of greater than approximately 2%.

4. The interconnect of claim 1, wherein at least one of the first member or the second member has an aspect ratio of at least 100, and the substantially parallel members of the first plurality and the substantially parallel members of the second plurality have non-uniform cross-sectional areas.

5. The interconnect of claim 1, wherein the first member and the second member share multiple common electrical contact points, thereby having connection redundancy between at least a first point and a second point.

6. The interconnect of claim 1, wherein the electrical pathway forms a structural support.

7. The interconnect of claim 1, wherein the electrical pathway has a contact point for an electrical interface, and the contact point has a cross-sectional area less than or equal to approximately 7850 square micrometers.

8. The interconnect of claim 1, wherein at least one of the first member or second member are formed of carbon.

9. A xerographic device comprising the interconnect of claim 1.

10. The interconnect of claim 1, wherein the electrical pathway is formed of a composition comprising a metallic element.

11. The interconnect of claim 1, wherein the electrical pathway includes a matrix of other material.

12. The interconnect of claim 11, wherein the other material is a polymer resin and the polymer resin contains at least one of a clay, a silica or a titania material.

13. The interconnect of claim 11, wherein the other material is a polymer resin and the polymer resin contains a thermosetting polymer, the thermosetting polymer providing in-process handling and shaping of the interconnect prior to, generally, completely curing.

14. The interconnect of claim 11, wherein the other material is a polymer resin and the polymer resin contains conductive ceramic materials.

15. The interconnect of claim 11, wherein the other material is a polymer resin and the polymer resin contains a nanoelement.

16. The interconnect of claim 15, wherein the nanoelement is formed of at least one of nickel, titanium, tungsten, copper, boron, tin, lead or a noble metal.

17. The interconnect of claim 15, wherein the nanoelement is formed of carbon.

18. The interconnect of claim 1, wherein the first member and the second member have fibrillated ends.

19. The interconnect of claim 18, wherein the first member and the second member are each substantially covered by a host polymer and a reinforcing metal coating.

20. The interconnect of claim 18, wherein the first member and the second member are each substantially covered by a host polymer over areas excluding the fibrillated ends.

* * * * *